United States Patent
Chang et al.

(10) Patent No.: US 11,456,207 B2
(45) Date of Patent: Sep. 27, 2022

(54) SEMICONDUCTOR DEVICE INCLUDING METAL INTERCONNECTIONS HAVING SIDEWALL SPACERS THEREON, AND METHOD FOR FABRICATING THE SAME

(71) Applicant: UNITED MICROELECTRONICS CORP., Hsin-Chu (TW)

(72) Inventors: Ching-Chih Chang, Tainan (TW); Yuan-Fu Ko, Tainan (TW); Chih-Sheng Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 259 days.

(21) Appl. No.: 16/518,928

(22) Filed: Jul. 22, 2019

(65) Prior Publication Data

US 2020/0402837 A1 Dec. 24, 2020

(30) Foreign Application Priority Data

Jun. 21, 2019 (TW) .................. 108121622

(51) Int. Cl.
*H01L 21/768* (2006.01)
*H01L 23/528* (2006.01)
*H01L 21/02* (2006.01)
*H01L 23/532* (2006.01)

(52) U.S. Cl.
CPC ...... *H01L 21/7682* (2013.01); *H01L 21/0217* (2013.01); *H01L 21/02164* (2013.01); *H01L 23/528* (2013.01); *H01L 23/53295* (2013.01)

(58) Field of Classification Search
CPC ........... H01L 21/7682; H01L 21/02164; H01L 21/0217; H01L 23/528; H01L 23/53295
USPC ......................................................... 257/288
See application file for complete search history.

(56) References Cited

U.S. PATENT DOCUMENTS

| | | |
|---|---|---|
| 5,981,395 A | 11/1999 | Huang et al. |
| 2009/0166881 A1* | 7/2009 | Balakrishnan .... H01L 23/53295 257/774 |
| 2016/0254226 A1 | 9/2016 | Wang et al. |
| 2017/0221891 A1* | 8/2017 | Chen .................... H01L 23/485 |

* cited by examiner

*Primary Examiner* — Matthew E. Gordon
(74) *Attorney, Agent, or Firm* — Winston Hsu

(57) ABSTRACT

A method for fabricating semiconductor device includes the steps of: forming a first inter-metal dielectric (IMD) layer on a substrate; forming a first metal interconnection in the first IMD layer; removing part of the first IMD layer; forming a spacer adjacent to the first metal interconnection; forming a second IMD layer on the spacer and the first metal interconnection; and forming a second metal interconnection in the second IMD layer and on the spacer and the first metal interconnection.

9 Claims, 2 Drawing Sheets

SEMICONDUCTOR DEVICE INCLUDING METAL INTERCONNECTIONS HAVING SIDEWALL SPACERS THEREON, AND METHOD FOR FABRICATING THE SAME

BACKGROUND OF THE INVENTION

1. Field of the Invention

The invention relates to a method for fabricating metal interconnection, and more particularly, to a method of forming spacer on sidewalls of metal interconnection.

2. Description of the Prior Art

As device dimensions continue to shrink, a reduction in interconnect line widths leads to increased line resistance (R) for signals. Further, reduced spacing between conducting lines creates more parasitic capacitance (C). The result is an increase in RC signal delay, which slows chip speed and lowers chip performance.

The line capacitance, C, is directly proportional to the dielectric constant, or k-value of a dielectric material. A low-k dielectric reduces the total interconnect capacitance of the chip, reduces the RC signal delay, and improves chip performance. Lowering the total capacitance also decreases power consumption. The use of a low-k dielectric material in conjunction with a low-resistance metal line provides an interconnect system with optimum performance for the VLSI technology. For this reason, prior art attempts to reduce the RC delays have focused on utilizing material with a low-k to fill the gaps between the metal lines.

Silicon dioxide ($SiO_2$) has been conventionally preferred as a dielectric material even though it has a relatively high dielectric constant (relative to vacuum) of about 4.1 to 4.5 because it is a thermally and chemically stable material and conventional oxide etching techniques are available for high-aspect-ratio contacts and via holes. However, as device dimensions decrease and the packing density increases, it is necessary to reduce the spacing between conductive lines to effectively wire up the integrated circuits. Therefore, a large number of lower dielectric constant materials are currently being investigated to reduce the RC value of the chip further. These include among many others fluorinated $SiO_2$, aerogels, and polymers. Another method being proposed to lower the dielectric constant even further is to form air gaps between the interconnect lines. While silicon dioxide has a dielectric constant of about 4 and greater, the dielectric constant of air is about 1.

Although air is the best dielectric material for lowering the RC value, unfortunately the use of air gap structures in integrated circuit fabrication has been hindered with problems. Overall mechanical strength of the device is reduced correspondingly and lead to structural deformation and a weakened structure can have serious effect in various aspects of subsequent integrated circuit fabrication. Accordingly, what is needed in the art is an air gap interconnect structure and method of manufacture thereof that addresses the above-discussed issues.

SUMMARY OF THE INVENTION

According to an embodiment of the present invention, a method for fabricating semiconductor device includes the steps of: forming a first inter-metal dielectric (IMD) layer on a substrate; forming a first metal interconnection in the first IMD layer; removing part of the first IMD layer; forming a spacer adjacent to the first metal interconnection; forming a second IMD layer on the spacer and the first metal interconnection; and forming a second metal interconnection in the second IMD layer and on the spacer and the first metal interconnection.

According to another aspect of the present invention, a semiconductor device includes: a first inter-metal dielectric (IMD) layer on a substrate; a first metal interconnection in the first IMD layer; a first spacer adjacent to one side of the first metal interconnection and on the first IMD layer; and a second metal interconnection on the first spacer and the first metal interconnection.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
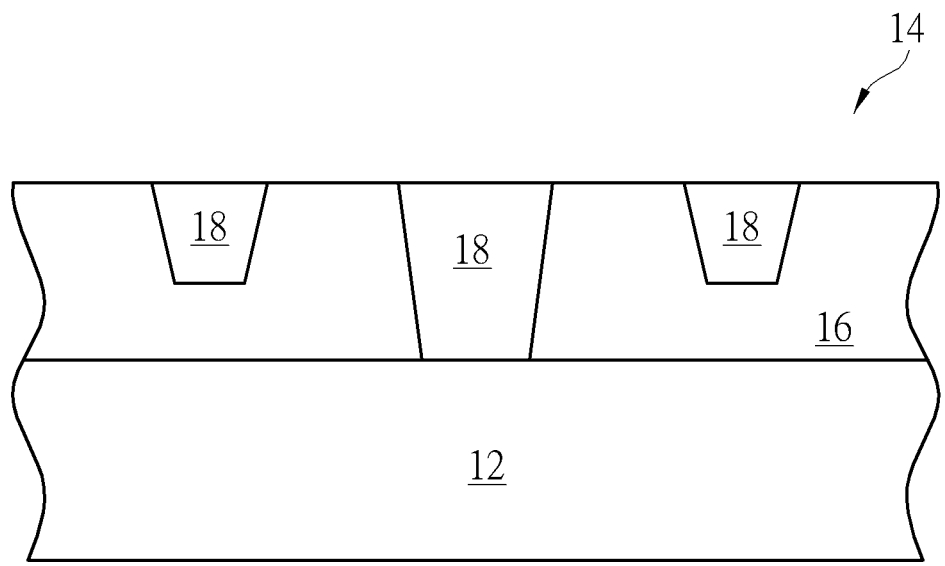
FIGS. 1-4 illustrate a method for fabricating metal interconnect structure according to an embodiment of the present invention.

Referring to FIGS. 1-4, FIGS. 1-4 illustrate a method for fabricating metal interconnect structure according to an embodiment of the present invention. As shown in FIG. 1, a substrate 12, such as a substrate composed of semiconductor material is provided, in which the semiconductor material could be selected from the group consisting of silicon, germanium, silicon germanium compounds, silicon carbide, and gallium arsenide. Active devices such as metal-oxide semiconductor (MOS) transistors, passive devices, conductive layers, and interlayer dielectric (ILD) layer (not shown) could also be formed on top of the substrate 12. More specifically, planar MOS transistors or non-planar (such as FinFETs) MOS transistors could be formed on the substrate 12, in which the MOS transistors could include transistor elements such as metal gates and source/drain region, spacer, epitaxial layer, contact etch stop layer (CESL), the ILD layer could be formed on the substrate 12 and covering the MOS transistors, and a plurality of contact plugs could be formed in the ILD layer to electrically connect to the gate and/or source/drain region of MOS transistors. Since the fabrication of planar or non-planar transistors and ILD layer is well known to those skilled in the art, the details of which are not explained herein for the sake of brevity.

Next, at least a set of metal interconnect structure 14 is formed on the ILD layer to electrically connect to the aforementioned contact plugs, in which the metal interconnect structure 14 includes an inter-metal dielectric (IMD) layer 16 and a plurality of metal interconnections 18 embedded within the IMD layer 16. It should be noted that despite only one set of metal interconnect structure 14 is disclosed in this embodiment, the quantity of metal interconnect structures is not limited to one, but could be adjusted according to the demand of the process. Moreover, each metal interconnections 18 in the metal interconnect structure 14 could include a trench conductor and/or a via conductor, and each of the metal interconnection 18 are also electrically connected to each other and embedded within the IMD layer 16 according to dual damascene processes. Since dual damascene process is well known to those skilled in the art, the details of which are not explained herein for the sake of brevity. In this embodiment, the metal interconnections 18 are preferably composed of copper and the IMD layer 16 is composed of silicon oxide, but not limited thereto.

Figure 2:
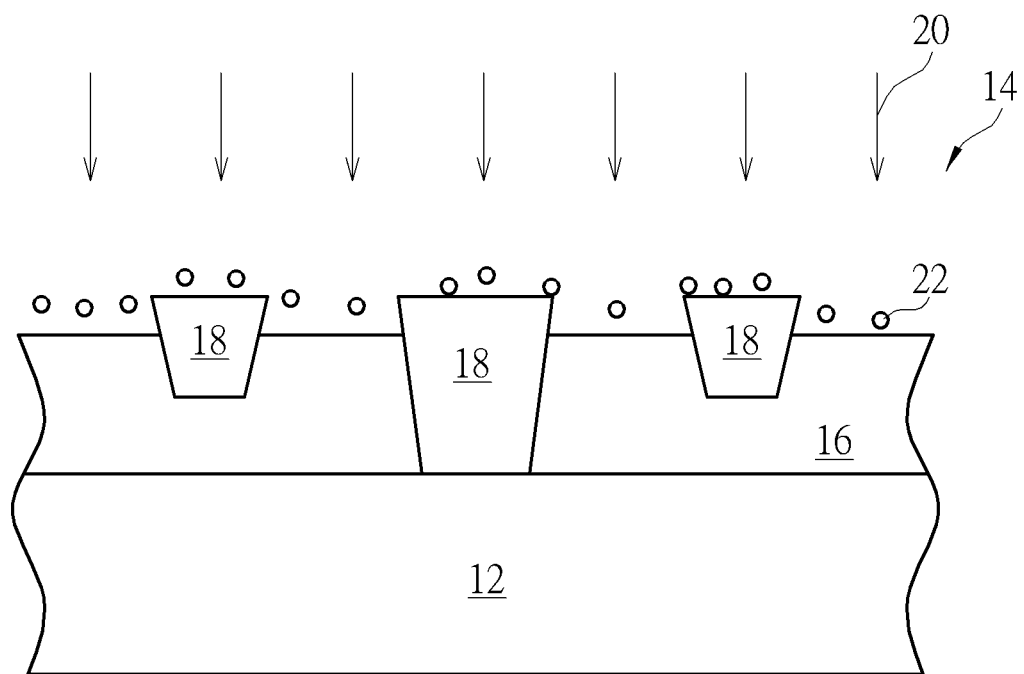

Next, as shown in FIG. 2, an etching process 20 is conducted by using the exposed metal interconnections 18 as mask to remove part of the IMD layer 16 so that the top surface of the remaining IMD layer 16 is slightly lower than the top surface of the metal interconnections 18 and part of the sidewalls of the metal interconnections 18 are exposed. It should be noted that the etching process 20 conducted at this stage could further include a dry etching process and a wet etching process, in which the dry etching process could be accomplished by employing gases including but not limited to for example $C_xF_y$ and/or nitrogen gas ($N_2$) to remove part of the IMD layer 16 whereas the wet etching process could be accomplished by employing hydrogen peroxide ($H_2O_2$) and/or diluted hydrogen fluoride (dHF) to remove impurities or remaining particles 22 adhered on surfaces of the IMD layer 16 and metal interconnections 18.

Figure 3:
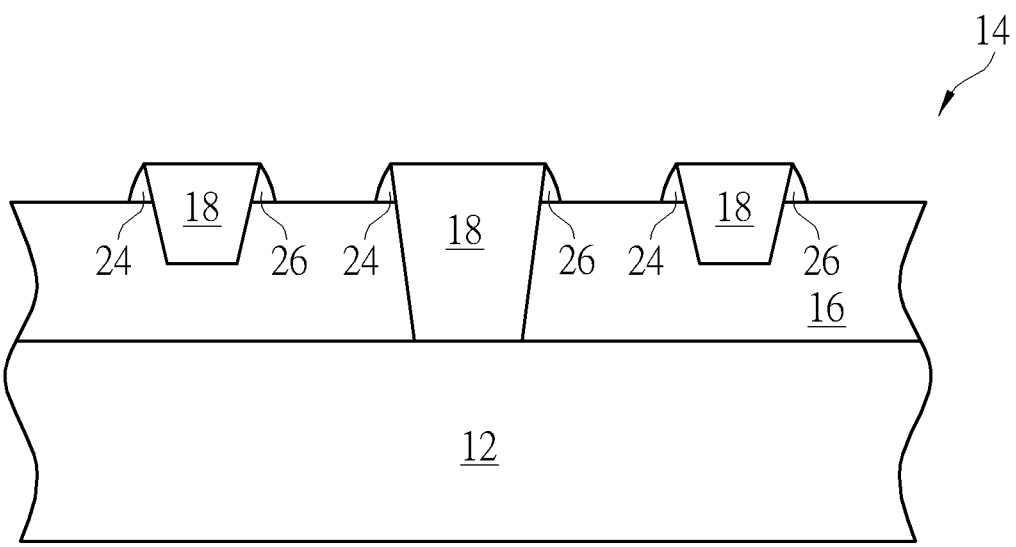

Next, as shown in FIG. 3, a cap layer (not shown) made of a dielectric layer or a low-k dielectric layer is formed on the surface of the IMD layer 16 and metal interconnections 18, and an etching process or more specifically a dry etching process is conducted by using gas such as $C_xF_y$ to remove part of the dielectric layer to form spacers 24, 26 on left and right sidewalls of each of the metal interconnections 18. In this embodiment, the spacers 24, 26 and the IMD layer 16 are preferably made of different materials, in which the spacer 24, 26 could be made of oxides, nitrides, metal oxides, or metal nitrides. According to an embodiment of the present invention, the spacer 24, 26 could include but not limited to for example silicon oxide ($SiO_2$), silicon nitride (SiN), silicon oxynitride (SiON), silicon carbon nitride (SiCN), silicon oxycarbide (SiOC), titanium nitride (TiN), aluminum nitride (AlN), tantalum nitride (TaN), hafnium nitride (HfN), titanium oxide (TiO), aluminum oxide (AlO), tantalum oxide (TaO), and/or hafnium oxide (HfO).

It should be noted that even though the top surface of the IMD layer 16 is slightly lower than the top surface of the metal interconnections 18 as shown in FIG. 2, according to another embodiment of the present invention, if each of the metal interconnections 18 include a trench conductor and a via conductor, it would be desirable to adjust the height of the remaining IMD layer 16 so that the top surface of the remaining IMD layer 16 is even with the bottom surface of the trench conductor. By following this approach, the bottom surface of the spacers 24, 26 would then be even with the bottom surface of the trench conductor (or trench conductors), which is also within the scope of the present invention.

Figure 4:
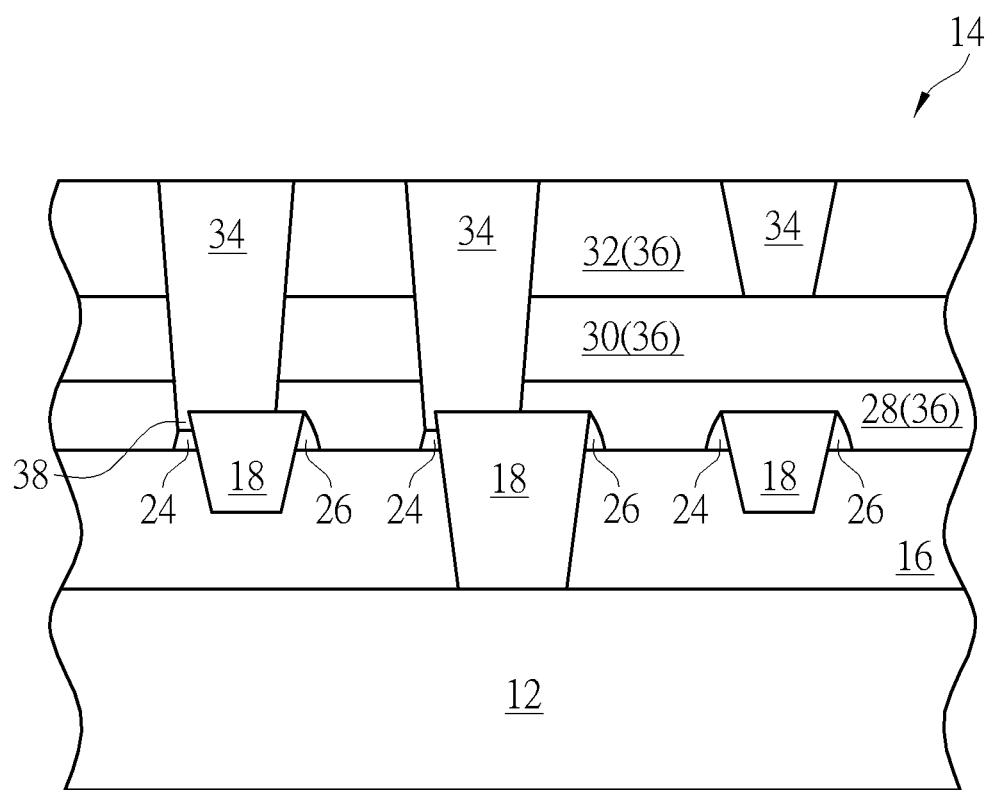

Next, as shown in FIG. 4, another IMD layer 36 is formed on the IMD layer 16 to cover the metal interconnections 18. For instance, a dielectric layer 28 could be formed on the surface of the IMD layer 16, a dielectric layer 30 is formed on the dielectric layer 28, and another dielectric layer 32 is formed on the surface of the dielectric layer 30. In this embodiment, the dielectric layer 28 preferably includes silicon nitride, the dielectric layer 30 includes silicon oxide, and the dielectric layer 32 includes a low-k dielectric layer. Next, a plurality of metal interconnections 24 are formed in the dielectric layers 28, 30, 32 to electrically connect the metal interconnections 18 or other wires, in which part of the metal interconnections 34 are shifted slightly away from the center of the metal interconnection 18 and extended over one sidewall of the metal interconnection 18 to land on both the metal interconnection 18 and one sidewall spacer 24 at the same time. This completes the fabrication of a metal interconnect structure according to an embodiment of the present invention. Similar to the metal interconnection 18, each of the metal interconnections 34 formed at this stage could include a trench conductor and/or a via conductor and each of the metal interconnections 34 could be formed in the dielectric layers 28, 30, 32 according to dual damascene process. Since dual damascene process is well known to those skilled in the art, the details of which are not explained herein for the sake of brevity. In this embodiment, the metal interconnections 34 are preferably made of copper, but not limited thereto.

Referring again to FIG. 4, FIG. 4 further illustrates a structural view of a semiconductor device according to an embodiment of the present invention. As shown in FIG. 4, the semiconductor device includes an IMD layer 16 disposed on the substrate 12, a plurality of metal interconnections 18 disposed in the IMD layer 16, a spacer 24 disposed on one side of each of the metal interconnections 18, a spacer 26 disposed on another side of each of the metal interconnections 18, metal interconnections 34 disposed on the spacers 24 and metal interconnections 18, and an IMD layer 36 disposed on the IMD layer 16 to surround the metal interconnections 18, in which the IMD layer 36 further includes dielectric layers 28, 30, 32.

Viewing from a more detailed perspective, in particular the leftmost metal interconnection 34 connected to the metal interconnection 18 in FIG. 4, the metal interconnection 34 is preferably extended leftward to surpass the sidewall or edge of the metal interconnection 18 and at the same time extended downward to form a protrusion 38 or protruding portion directly contacting the sidewall of the metal interconnection 18 and the spacer 24 on left side of the metal interconnection 18. Meanwhile, the sidewall of the metal interconnection 34 is aligned with the sidewall of the spacer 24. Overall, the spacer 24 on left sidewall of the metal interconnection 18 and the spacer 26 on right sidewall of the metal interconnection 18 are asymmetrical structures, in which the definition of asymmetry in this instance could refer to that the spacers 24, 26 having different heights, different widths, and/or different shapes. In this embodiment, the top surface of the spacer 24 on left sidewall of the metal interconnection 18 is slightly lower than the top surface of the spacer 26 and since part of the top portion of the spacer 24 is removed during formation of the protrusion 38, the top surface of the spacer 24 preferably includes a planar surface while the spacer 26 on the right includes a half-moon shape profile or cross-section.

Overall, the present invention first removes part of the IMD layer during metal interconnective process, forms sidewall spacers on left and right sidewalls of the lower level metal interconnection, and then forms upper level metal interconnections to electrically connect the lower level metal interconnections, in which at least one of the upper level metal interconnections is slightly shifted away from the center of the lower level metal interconnection while landing on part of the lower level metal interconnection and a spacer adjacent to one sidewall of the lower level metal interconnection. Typically, no barrier or stopping structure is disposed adjacent to sidewalls of the lower level metal interconnection in conventional art so that when upper level metal interconnection is connected to the lower level metal interconnection, protrusion 38 or tiger tooth structure shown in FIG. 4 formed during the metal interconnective process is extended further downward thereby resulting in severe leakage. To resolve this issue, the present invention preferably forms spacers on sidewalls of the lower level metal interconnection to serve as a barrier or stopping structure for the upper level metal interconnections so that when the upper and lower level metal interconnections are connected, protrusions 38 would not be over extended downward to induce serious leakage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a first inter-metal dielectric (IMD) layer on a substrate and comprising a single layer;
   a first metal interconnection in the first IMD layer, wherein a bottom surface of the first metal interconnection is flush with a bottom surface of the first IMD layer;
   a first spacer adjacent to one side of the first metal interconnection and on the first IMD layer, wherein a bottom surface of the spacer is flush with a top surface of the first IMD layer;
   a second inter-metal dielectric (IMD) layer on the first IMD layer, wherein the second IMD layer comprises:
   a first dielectric layer covering the first spacer and a top surface of the first metal interconnection;
   a second dielectric layer on the first dielectric layer; and
   a third dielectric layer on the second dielectric layer; and
   a second metal interconnection completely through the third dielectric layer, the second dielectric layer and the first dielectric layer to directly contact the first spacer and the first metal interconnection.

2. The semiconductor device of claim 1, wherein the first dielectric layer comprises silicon nitride (SiN).

3. The semiconductor device of claim 1, wherein the second dielectric layer comprises silicon oxide.

4. The semiconductor device of claim 1, wherein the third dielectric layer comprises a low-k dielectric layer.

5. The semiconductor device of claim 1, wherein the second metal interconnection contacts the first spacer and the first metal interconnection directly.

6. The semiconductor device of claim 1, wherein a sidewall of the second metal interconnection is aligned with a sidewall of the first spacer.

7. The semiconductor device of claim 1, further comprising a second spacer adjacent to another side of the first metal interconnection.

8. The semiconductor device of claim 7, wherein the first spacer and the second spacer are asymmetrical.

9. The semiconductor device of claim 7, wherein a top surface of the first spacer is lower than a top surface of the second spacer.

* * * * *